US010361076B2

(12) United States Patent
Kang et al.

(10) Patent No.: US 10,361,076 B2
(45) Date of Patent: Jul. 23, 2019

(54) GAPFILL OF VARIABLE ASPECT RATIO FEATURES WITH A COMPOSITE PEALD AND PECVD METHOD

(71) Applicant: Lam Research Corporation, Fremont, CA (US)

(72) Inventors: Hu Kang, Tualatin, OR (US); Shankar Swaminathan, Beaverton, OR (US); Jun Qian, Sherwood, OR (US); Wanki Kim, Gyeoggi (KR); Dennis Hausmann, Lake Oswego, OR (US); Bart J. van Schravendijk, Palo Alto, CA (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/654,186

(22) Filed: Jul. 19, 2017

(65) Prior Publication Data

US 2017/0323786 A1 Nov. 9, 2017

Related U.S. Application Data

(60) Division of application No. 14/987,542, filed on Jan. 4, 2016, now Pat. No. 9,793,110, which is a
(Continued)

(51) Int. Cl.
*H01L 21/02* (2006.01)
*C23C 16/04* (2006.01)
(Continued)

(52) U.S. Cl.
CPC ...... *H01L 21/02274* (2013.01); *C23C 16/045* (2013.01); *C23C 16/345* (2013.01);
(Continued)

(58) Field of Classification Search
None
See application file for complete search history.

(56) References Cited

U.S. PATENT DOCUMENTS

| 4,500,563 A | 2/1985 | Ellenberger et al. |
| 5,094,984 A | 3/1992 | Liu et al. |

(Continued)

FOREIGN PATENT DOCUMENTS

| CN | 1732288 A | 2/2006 |
| CN | 1841676 A | 10/2006 |

(Continued)

OTHER PUBLICATIONS

U.S. Office Action dated Jan. 24, 2018 issued in U.S. Appl. No. 13/963,212.
(Continued)

*Primary Examiner* — Michelle Mandala
(74) *Attorney, Agent, or Firm* — Weaver Austin Villeneuve & Sampson LLP

(57) ABSTRACT

Provided herein are methods and apparatus for filling one or more gaps on a semiconductor substrate. The disclosed embodiments are especially useful for forming seam-free, void-free fill in both narrow and wide features. The methods may be performed without any intervening etching operations to achieve a single step deposition. In various implementations, a first operation is performed using a novel PEALD fill mechanism to fill narrow gaps and line wide gaps. A second operation may be performed using PECVD methods to continue filling the wide gaps.

4 Claims, 9 Drawing Sheets

Related U.S. Application Data continuation of application No. 14/137,860, filed on Dec. 20, 2013, now Pat. No. 9,257,274, which is a continuation-in-part of application No. 13/084,399, filed on Apr. 11, 2011, now Pat. No. 8,728,956.

(60) Provisional application No. 61/884,923, filed on Sep. 30, 2013, provisional application No. 61/324,710, filed on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010.

(51) Int. Cl.

| | | |
|---|---|---|
| *C23C 16/34* | (2006.01) | |
| *C23C 16/40* | (2006.01) | |
| *C23C 16/455* | (2006.01) | |
| *C23C 16/56* | (2006.01) | |
| *H01L 21/67* | (2006.01) | |
| *H01L 21/762* | (2006.01) | |
| *H01L 21/768* | (2006.01) | |
| *H01L 21/285* | (2006.01) | |

(52) U.S. Cl.
CPC ........ *C23C 16/402* (2013.01); *C23C 16/4554* (2013.01); *C23C 16/45523* (2013.01); *C23C 16/56* (2013.01); *H01L 21/022* (2013.01); *H01L 21/0228* (2013.01); *H01L 21/02164* (2013.01); *H01L 21/02211* (2013.01); *H01L 21/02219* (2013.01); *H01L 21/67201* (2013.01); *H01L 21/76224* (2013.01); *H01L 21/76229* (2013.01); *H01L 21/76837* (2013.01); *H01L 21/28562* (2013.01); *H01L 21/76826* (2013.01)

(56) References Cited

U.S. PATENT DOCUMENTS

| | | |
|---|---|---|
| 5,223,443 A | 6/1993 | Chinn et al. |
| 5,318,928 A | 6/1994 | Gegenwart et al. |
| 5,496,608 A | 3/1996 | Matsuda et al. |
| 5,593,914 A | 1/1997 | Evans, Jr. et al. |
| 5,670,432 A | 9/1997 | Tsai |
| 5,856,003 A | 1/1999 | Chiu |
| 5,874,368 A | 2/1999 | Laxman et al. |
| 5,916,365 A | 6/1999 | Sherman |
| 5,932,286 A | 8/1999 | Beinglass et al. |
| 6,069,058 A | 5/2000 | Hong |
| 6,100,202 A | 8/2000 | Lin et al. |
| 6,156,149 A | 12/2000 | Cheung et al. |
| 6,218,293 B1 | 4/2001 | Kraus et al. |
| 6,270,572 B1 | 8/2001 | Kim et al. |
| 6,346,741 B1 | 2/2002 | Van Buskirk et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,482,726 B1 | 11/2002 | Aminpur et al. |
| 6,509,601 B1 | 1/2003 | Lee et al. |
| 6,528,430 B2 | 3/2003 | Kwan et al. |
| 6,551,893 B1 | 4/2003 | Zheng et al. |
| 6,569,501 B2 | 5/2003 | Chiang et al. |
| 6,576,053 B1 | 6/2003 | Kim et al. |
| 6,602,784 B2 | 8/2003 | Sneh |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic et al. |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,097,886 B2 | 8/2006 | Moghadam et al. |
| 7,109,129 B1 | 9/2006 | Papasouliotis |
| 7,115,166 B2 | 10/2006 | Vaartstra et al. |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,235,484 B2 | 6/2007 | Nguyen et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,745,346 B2 | 6/2010 | Hausmann et al. |

(56) References Cited

U.S. PATENT DOCUMENTS

| | | |
|---|---|---|
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 | 1/2011 | Papasouliotis et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,673,041 B2 | 6/2017 | Swaminathan et al. |
| 9,685,320 B2 | 6/2017 | Kang et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2003/0216006 A1* | 11/2003 | Li .................... C23C 16/045 438/424 |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0183055 A1 | 8/2006 | O'Neill et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1 | 10/2007 | Nemani et al. |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |

(56) References Cited

U.S. PATENT DOCUMENTS

| | | |
|---|---|---|
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0255218 A1 | 10/2010 | Oka et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0161405 A1 | 6/2012 | Mohn et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0258261 A1 | 10/2012 | Reddy et al. |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0084688 A1 | 4/2013 | O'Meara et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0344248 A1 | 12/2013 | Clark |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1 | 3/2014 | Wang et al. |
| 2014/0094035 A1 | 4/2014 | Ji et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2015/0041867 A1 | 2/2015 | Han |
| 2015/0048740 A1 | 2/2015 | Valcore, Jr. et al. |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |
| 2016/0251756 A1 | 9/2016 | Lansalot-Matras et al. |
| 2016/0260584 A1 | 9/2016 | Marakhtanov et al. |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0336178 A1 | 11/2016 | Swaminathan et al. |
| 2016/0340782 A1 | 11/2016 | Chandrasekharan et al. |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0092735 A1 | 3/2017 | Hashemi et al. |
| 2017/0103891 A1 | 4/2017 | Lee et al. |

(56) References Cited

U.S. PATENT DOCUMENTS

| | | |
|---|---|---|
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2018/0005801 A1 | 1/2018 | Singhal et al. |
| 2018/0005814 A1 | 1/2018 | Kumar et al. |
| 2018/0061628 A1 | 3/2018 | Ou et al. |
| 2018/0138028 A1 | 5/2018 | Henri et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0080903 A1 | 3/2019 | Abel et al. |

FOREIGN PATENT DOCUMENTS

| | | |
|---|---|---|
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-9072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2007-165883 | 6/2007 |
| JP | 2007-180362 A | 7/2007 |
| JP | 2007-189173 A | 7/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-522405 A | 6/2008 |
| JP | 2008-182199 A | 8/2008 |
| JP | 2008-258591 A | 10/2008 |
| JP | 2008-306093 A | 12/2008 |
| JP | 2009-65203 A | 3/2009 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-530127 | 9/2010 |
| JP | 2010-245518 A | 10/2010 |
| JP | 2010-283388 A | 12/2010 |
| JP | 2010-539730 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-506640 A | 3/2012 |
| JP | 2012-199306 | 10/2012 |
| JP | 2013-102130 A | 5/2013 |
| JP | 2013166965 A | 8/2013 |
| JP | 2013-196822 A | 9/2013 |
| JP | 2013225655 A | 10/2013 |
| JP | 2013-240042 A | 11/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0721503 B1 | 5/2007 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-20130056608 A | 5/2013 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Office Action dated Sep. 26, 2017 issued in U.S. Appl. No. 15/426,889.

U.S. Notice of Allowance dated Mar. 28, 2018 issued in U.S. Appl. No. 15/426,889.

U.S. Notice of Allowance dated Jan. 29, 2018 issued in U.S. Appl. No. 15/650,662.

U.S. Notice of Allowance dated Aug. 22, 2017 issued in U.S. Appl. No. 14/987,542.

U.S. Final Office Action dated Sep. 20, 2017 issued in U.S. Appl. No. 14/194,549.

U.S. Notice of Allowance dated Feb. 14, 2018 issued in U.S. Appl. No. 14/194,549.

U.S. Notice of Allowance dated Oct. 4, 2017 issued in U.S. Appl. No. 15/224,347.

(56) References Cited

OTHER PUBLICATIONS

U.S. Notice of Allowance [Corrected Notice of Allowability] dated Nov. 28, 2017 issued in U.S. Appl. No. 15/224,347.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Notice of Allowance dated Sep. 28, 2017 issued in U.S. Appl. No. 15/399,637.
U.S. Office Action dated Aug. 18, 2017 issued in U.S. Appl. No. 15/201,221.
U.S. Notice of Allowance dated Apr. 9, 2018 issued in U.S. Appl. No. 15/201,221.
U.S. Office Action dated Oct. 6, 2017 issued in U.S. Appl. No. 15/253,301.
U.S. Notice of Allowance dated Mar. 26, 2018 issued in U.S. Appl. No. 15/253,301.
U.S. Office Action dated Jan. 26, 2018 issued in U.S. Appl. No. 15/683,397.
Korean Office Action, dated Aug. 23, 2017, issued in Application No. KR 10-2017-7020548.
Korean Office Action, dated Nov. 27, 2017, issued in Application No. KR 10-2013-7010291.
Korean Decision for Grant of Patent, dated Jul. 25, 2018, issued in Application No. KR 10-2013-7010291.
Taiwan Office Action dated Oct. 19, 2017 issued in Application No. TW 105130207.
Taiwan First Office Action dated Mar. 14, 2018 issued in Application No. TW 106122777.
Korean First Office Action dated Oct. 31, 2017 issued in Application No. KR 10-2014-7008696.
Chinese Third Office Action dated Oct. 17, 2017 issued in Application No. CN 201310021460.8.
Chinese Fourth Office Action dated May 16, 2018 issued in Application No. CN 201310021460.8.
European Examination Report dated Dec. 11, 2017 issued in Application No. EP 13 15 2046.
Japanese Decision of Rejection dated Jan. 9, 2018 issued in Application No. JP 2013-007612.
Japanese Decision of Refusal dated Dec. 5, 2017 issued in Application No. JP2014-554825.
Japanese Notice of Reason for Refusal dated Jul. 24, 2018 issued in Application No. JP 2017-159931.
Taiwan Rejection Decision dated Aug. 17, 2017 issued in Application No. TW 102117772.
Japanese First Office Action dated Oct. 31, 2017 issued in Application No. JP 2013-230782.
Japanese Second Office Action dated May 22, 2018 issued in Application No. JP 2013-230782.
Japanese Decision to Grant dated Sep. 10, 2018 issued in Application No. JP 2013-230782.
Japanese Office Action dated Dec. 5, 2017 issued in Application No. JP 2013-231188.
Taiwan Examination Report dated Jul. 13, 2017 issued in Application No. TW 102140721.
Taiwan First Office Action dated May 3, 2018 issued in Application No. TW 103133765.
Taiwan First Office Action dated Jun. 26, 2018 issued in Application No. TW 103145386.
Chinese Second Office Action dated Mar. 26, 2018 issued in Application No. CN 201510091775.9.
Taiwanese First Office Action dated Sep. 14, 2018 issued in Application No. TW 104106165.
Taiwan Notice of Allowance and Search Report dated Aug. 30, 2018 issued in Application No. TW 104104471.
Taiwan First Office Action dated Sep. 13, 2018, issued in Application No. TW 104104648.
Chinese Third Office Action dated Dec. 22, 2017, issued in Application No. CN 201380006994.1.
Chinese First Office Action dated Mar. 30, 2018 issued in Application No. CN 201610206201.6.
Faraz et al., (2015) "Atomic Layer Etching. What Can We Learn from Atomic Layer Deposition?," *ECS Journal of Solid State Science and Technology*, 4(6):N5023-N5032.
Elam et al., (2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, *University of Texas*, 113pp.
U.S. Appl. No. 15/703,917, filed Sep. 13, 2017, Abel et al.
U.S. Appl. No. 16/036,784, filed Jul. 16, 2018, Ou et al.
U.S. Appl. No. 16/034,022, filed Jul. 12, 2018, Kumar et al.
U.S. Office Action dated Jul. 18, 2018 issued in U.S. Appl. No. 15/703,917.
U.S. Office Action dated Mar. 15, 2013 issued in U.S. Appl. No. 13/084,399.
U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.

(56) References Cited

OTHER PUBLICATIONS

U.S. Examiner's Answer to Appeal Brief (filed May 22, 2014) Before the Patent Trial and Appeal Board dated Aug. 14, 2014 issued U.S. Appl. No. 13/224,240.
U.S. Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Jul. 15, 2016 issued in U.S. Appl. No. 14/678,736.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
Korean Office Action, dated Feb. 7, 2017, issued in Application No. KR 2012-7004925.
Taiwan Office Action dated Apr. 27, 2016 issued in Application No. TW 100113041.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Taiwan Office Action dated May 5, 2016 issued in TW 100134208.
PCT International Search Report and Written Opinion dated Dec. 18, 2012, issued in Application No. PCT/US2012/052769.

(56) References Cited

OTHER PUBLICATIONS

PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in SG 11201400633R.
Taiwan Notice of Allowance and Search Report dated Dec. 18, 2015 issued in Application No. TW 101134692.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in CN 201310021460.8.
Chinese Second Office Action dated Apr. 13, 2017 issued in CN 201310021460.8.
European Extended Search Report dated Apr. 14, 2014 issued in Application No. EP 13 15 2046.
Japanese Office Action dated Jan. 10, 2017 issued in JP 2013-007612.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
Taiwan Examination Report dated Mar. 29, 2017 issued in TW 102102054.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in JP2014-554825.
Singapore Supplementary Examination Report dated Aug. 11, 2016 issued in SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Examination Report dated Jan. 11, 2017 issued in Application No. TW 102138326.
Chinese First Office Action dated Nov. 28, 2016 issued in Application No. CN 201410521390.7.
Chinese First Office Action dated May 27, 2017 issued in Application No. CN 201510091775.9.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Cecchi et al., (2007) "Ultra-thin conformal pore-sealing of low-k materials by plasma-assisted ALD," *University of New Mexico, Albuquerque, NM, Sandia National Labs, Albuquerque, NM*, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Hausmann et al., (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
"PlasmaPro™ NGP® 80 Range," *Oxford Instruments* (2010), 8 pages.
Puurunen, Riikka L. (2005) "Surface chemistry of atomic layer deposition: A case study for the trimethylaluminum/water process," *Journal of Applied Physics*, 97:121301-1-121301-52.
Van der Straten et al., (2004) "Atomic layer deposition of tantalum nitride for ultrathin liner applications in advanced copper metallization schemes," *Journal of Materials Research*, 19(2):447-453.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/199,608, filed Jun. 30, 2016, Singhal.
U.S. Appl. No. 15/609,864, filed May 31, 2017, Swaminathan et al.
U.S. Notice of Allowance dated Jun. 27, 2017 issued in U.S. Appl. No. 15/199,608.
U.S. Final Office Action dated Nov. 16, 2018 issued in U.S. Appl. No. 15/683,397.
Korean First Office Action dated Oct. 2, 2018 issued in Application No. KR 10-2014-7010949.

(56) References Cited

OTHER PUBLICATIONS

Taiwan Second Office Action dated Dec. 14, 2018 issued in Application No. TW 106122777.
Korean Second Office Action dated Sep. 20, 2018 issued in Application No. KR 10-2014-7008696.
Japanese Second Office Action [Decision of Rejection] dated Dec. 4, 2018 issued in Application No. JP 2013-231188.
Taiwan First Office Action dated Sep. 20, 2018 issued in Application No. TW 106140906.
Japanese First Office Action dated Dec. 18, 2018 issued in Application No. JP 2014-262248.
Chinese Third Office Action dated Oct. 15, 2018 issued in Application No. CN 201510091775.9.
Taiwanese First Office Action dated Nov. 9, 2018 issued in Application No. TW 104122669.
Chinese Second Office Action dated Jan. 24, 2019 issued in Application No. CN 201610206201.6.
Chinese First Office Action dated Oct. 8, 2018 issued in Application No. CN 201710522311.8.
U.S. Notice of Allowance dated Dec. 5, 2018 issued in U.S. Appl. No. 15/703,917.
US Office Action dated Mar. 21, 2019 issued in U.S. Appl. No. 15/976,793.
US Office Action dated Mar. 21, 2019 issued in U.S. Appl. No. 16/034,022.
US Notice of Allowance dated Mar. 28, 2019 issued in U.S. Appl. No. 15/683,397.
Chinese Fourth Office Action dated Mar. 27, 2019 issued in Application No. CN 201510091775.9.
Singapore Search Report and Written Opinion dated Mar. 14, 2019 issued in Application No. SG 10201807090Q.
PCT International Search Report and Written Opinion dated Feb. 25, 2019 issued in Application No. PCT/US2018/050049.

\* cited by examiner

GAPFILL OF VARIABLE ASPECT RATIO FEATURES WITH A COMPOSITE PEALD AND PECVD METHOD

CROSS-REFERENCE TO RELATED APPLICATIONS

This application is a divisional of and claims priority to U.S. application Ser. No. 14/987,542, filed Jan. 4, 2016, titled "GAPFILL OF VARIABLE ASPECT RATIO FEATURES WITH A COMPOSITE PEALD AND PECVD METHOD," which is a continuation of U.S. application Ser. No. 14/137,860 (issued as U.S. Pat. No. 9,257,274), filed Dec. 20, 2013, titled "GAPFILL OF VARIABLE ASPECT RATIO FEATURES WITH A COMPOSITE PEALD AND PECVD METHOD," which claims the benefit of U.S. Provisional Application No. 61/884,923, filed Sep. 30, 2013, titled "GAPFILL OF VARIABLE ASPECT RATIO FEATURES WITH A COMPOSITE PEALD AND PECVD METHOD," all of which are incorporated herein by reference in their entireties and for all purposes. U.S. application Ser. No. 14/137,860 is also a continuation-in-part of U.S. patent application Ser. No. 13/084,399 (issued as U.S. Pat. No. 8,728,956), filed Apr. 11, 2011, and titled "PLASMA ACTIVATED CONFORMAL FILM DEPOSITION," which claims benefit of the following prior U.S. Provisional Application Nos. 61/324,710, filed Apr. 15, 2010, and titled "PLASMA ACTIVATED CONFORMAL FILM DEPOSITION"; 61/372,367, filed Aug. 10, 2010, and titled "PLASMA ACTIVATED CONFORMAL FILM DEPOSITION"; 61/379,081, filed Sep. 1, 2010, and titled "PLASMA ACTIVATED CONFORMAL FILM DEPOSITION"; and 61/417,807, filed Nov. 29, 2010, and titled "PLASMA ACTIVATED CONFORMAL FILM DEPOSITION," all of which are herein incorporated by reference in their entireties and for all purposes.

BACKGROUND

The fabrication of integrated circuits includes many diverse processing steps. One of the operations frequently employed is the deposition of a dielectric film into a gap between features patterned over or into silicon substrates. One of the goals in depositing such material is to form a void-free, seam-free fill in the gap. As device dimensions become smaller in the context of DRAM, flash memory and logic, for example, it has become increasingly difficult to achieve this type of ideal fill.

While deposition methods such as high density plasma (HDP), sub-atmospheric chemical vapor deposition (SACVD), and low pressure chemical vapor deposition (LPCVD) have been used for gap fill, these methods do not achieve the desired fill capability. Flowable chemical vapor deposition and spin-on dielectric (SOD) methods can achieve the desired fill, but tend to deposit highly porous films. Further, these methods are especially complex and costly to integrate, as they require many extra processing steps. Atomic layer deposition (ALD) processes have also been used for gap fill, but these processes suffer from long processing times and low throughput, especially for large gaps. In some cases, multi-step deposition processes are used, including deposition-etch-deposition processes which require distinct etching operations between subsequent deposition operations. The etching may be done to remedy or prevent void formation in the gap. While this method is useful, it would be preferable to use a process that involves only deposition, with no required etch operations.

A further challenge is simultaneously filling gaps of different sizes on a substrate. For example, a deposition method optimized for a wide gap with a small aspect ratio may not be suitable for filling a narrow gap with a large aspect ratio, and vice versa. Therefore, a method of achieving void-free, seam-free fill of dielectric material into a gap is needed, particularly one that may be used to simultaneously fill gaps of various sizes.

SUMMARY

Certain embodiments herein relate to methods and apparatus for filling a gap on a semiconductor substrate. In certain cases, the gap is filled through a plasma enhanced atomic layer deposition (PEALD) operation. In other cases, the gap is filled through a hybrid method including both PEALD and plasma enhanced chemical vapor deposition (PECVD) operations. In one aspect of the embodiments herein, a method is provided for filling a gap including (a) introducing a first reactant in vapor phase into a reaction chamber having the substrate therein, and allowing the first reactant to adsorb onto the substrate surface; (b) introducing a second reactant in vapor phase into the reaction chamber and allowing the second reactant to adsorb onto the substrate surface; (c) exposing the substrate surface to plasma to drive a surface reaction between the first and second reactants on the substrate surface to form a film layer that lines the bottom and sidewalls of the gap; (d) sweeping the reaction chamber without performing a pumpdown; and (e) repeating operations (a) through (d) to form additional film layers, where when opposing film layers on opposite sidewalls of the gap approach one another, surface groups present on the opposing film layers crosslink with one another to thereby fill the gap. The methods may be used to fill the gap without the formation of a void or seam.

In some embodiments, the first reactant is a silicon-containing reactant and the second reactant is an oxidizing reactant. For example, the first reactant may include bis (tertiary-butyl-amino)silane (BTBAS). In a further example, the second reactant may include oxygen and/or nitrous oxide. In various cases, the gap is reentrant. Further, in many embodiments, the gap is filled through a mechanism that may be characterized at least in part as a bottom-up fill mechanism. This bottom-up fill mechanism may achieve a seam-free, void-free fill, even where a gap is reentrant.

In another aspect of the disclosed embodiments, a method of filling a gap on a substrate surface is provided, including (a) introducing a first reactant in vapor phase into a reaction chamber having the substrate therein, and allowing the first reactant to adsorb onto the substrate surface; (b) introducing a second reactant in vapor phase into the reaction chamber and allowing the second reactant to adsorb onto the substrate surface; and (c) exposing the substrate surface to plasma to drive a surface reaction between the first and second reactants on the substrate surface to form a film layer that lines the bottom and sidewalls of the gap, where the film is denser and/or thinner near the field region and upper sidewalls of the gap compared to near the bottom and lower sidewalls of the gap. The method may include an operation of (d) sweeping the reaction chamber without performing a pumpdown after (c) is performed. In some embodiments, the method includes repeating operations (a) through (c) (or (a) through (d)) to form additional film layers to thereby fill the gap. In certain embodiments the gap may be filled through a bottom-up fill mechanism, without the formation of a void or seam.

In another aspect of the disclosed embodiments, a method of filling a gap on a substrate surface is provided, including (a) introducing a first reactant in vapor phase into a reaction chamber having the substrate therein, and allowing the first reactant to adsorb onto the substrate surface; (b) introducing a second reactant in vapor phase into the reaction chamber and allowing the second reactant to adsorb onto the substrate surface; (c) exposing the substrate surface to plasma to drive a surface reaction between the first and second reactants on the substrate surface to form a film layer that lines the bottom and sidewalls of the gap, (d) sweeping the reaction chamber without performing a pumpdown; and repeating operations (a) through (d) to form additional film layers where ligands of one or more reactants are preferentially buried in the film near the bottom and lower sidewalls of the gap compared to the field region and upper sidewalls of the gap. The method may include an operation of (d) sweeping the reaction chamber without performing a pumpdown after (c) is performed. In certain embodiments, the gap may be filled through a bottom-up fill mechanism without the formation of a void or seam.

In a further aspect of the disclosed embodiments, a method of filling a gap on a substrate surface is provided, including (a) introducing a first reactant in vapor phase into a reaction chamber having the substrate therein, and allowing the first reactant to adsorb onto the substrate surface; (b) introducing a second reactant in vapor phase into the reaction chamber and allowing the second reactant to adsorb onto the substrate surface; (c) exposing the substrate surface to plasma to drive a surface reaction between the first and second reactants on the substrate surface to form a film lining the gap; (d) sweeping or purging the reaction chamber; (e) introducing a third reactant in vapor phase and fourth reactant in vapor phase into the reaction chamber concurrently; and (f) generating a plasma from the vapor phase reactants to drive a gas phase reaction between the third and fourth reactants, where the gas phase reaction produces a gap-filling material, and where the gap-filling material partially or completely fills the gap on the substrate surface.

The first and second reactants may be the same as at least one of the third and fourth reactants. For example, the first and second reactants may each be the same as the third and fourth reactants. In other cases, there may be no overlap between the first and second reactants and the third and fourth reactants. In many cases, the film formed in (c) is the same material as the gap-filling material formed in (f). For example, the film formed in (c) and the gap-filling material formed in (f) may be silicon oxide. In these cases, the first reactant may be a silicon-containing reactant and the second reactant may be an oxidizing reactant. For example, the first reactant may include BTBAS. In a further example, the second reactant may include oxygen and/or nitrous oxide. In these or other cases, examples of the third reactant may be TEOS or silane, with examples of the fourth reactant being an oxidizing reactant.

In some implementations, operations (a) through (c) are repeated before operations (e) through (f), and no pumpdown occurs after each iteration of operation (c). In these or other cases, the method may be performed without any intervening etching operations. One advantage of the disclosed embodiments is that the method may be performed in a single reaction chamber. In many cases, the substrate is not removed from the reaction chamber during or between any of operations (a) through (f). In some implementations, operations (a) through (c) include forming a conformal film that is thicker at the bottom of the gap than on the upper sidewalls of the gap. This may be achieved in a variety of ways. In some embodiments, operation (c) may include preferentially densifying the film near the top of the gap compared to the film near the bottom of the gap. In these or other embodiments, operation (c) may include preferentially burying ligands of one or more reactants in the film near the bottom of the gap compared to near the upper sidewalls of the gap. Operation (c) may also include promoting cross-linking between the film formed on a first sidewall of the gap and the film formed on an opposing sidewall of the gap.

In yet another aspect of the disclosed embodiments, a method of filling gaps on a substrate surface is provided, including (a) introducing a first reactant in vapor phase into a reaction chamber having the substrate therein, and allowing the first reactant to adsorb onto the substrate surface, where the substrate has at least a narrow gap having a critical dimension less than about 50 nm and a wide gap having a critical dimension greater than or equal to about 50 nm; (b) introducing a second reactant in vapor phase into the reaction chamber and allowing the second reactant to adsorb onto the substrate surface; (c) exposing the substrate surface to plasma to drive a surface reaction between the first and second reactants on the substrate surface to form a film, where the film completely fills the narrow gap and lines the wide gap; (d) sweeping or purging the reaction chamber; (e) introducing a third reactant in vapor phase and fourth reactant in vapor phase into the reaction chamber concurrently; and (f) generating a plasma from the vapor phase reactants to drive a gas phase reaction between the third and fourth reactants, where the gas phase reaction produces a gap-filling material, and wherein the gap-filling material partially or completely fills the wide gap on the substrate surface.

In some cases, the narrow gap has an aspect ratio of greater than about 4:1 and the wide gap has an aspect ratio of less than or equal to about 4:1. The narrow gap may be reentrant in some embodiments. Even where the narrow gap is reentrant, it may be filled without forming seams or voids. In some implementations, operations (a) through (c) are repeated before operations (e) through (f), and no pumpdown occurs after each iteration of operation (c). In these or other cases, the film formed in (c) may be the same material as the gap-filling material formed in (f). In many embodiments, the method is performed without any intervening etching operations. The disclosed embodiments allow the narrow gap and wide gap to be filled without forming seams or voids.

In a further aspect of the disclosed embodiments, an apparatus for filling gaps on a semiconductor substrate is disclosed. The apparatus may include a reaction chamber, a substrate supporter, a plasma generation source, one or more process gas inlets, one or more outlets, and a controller. The controller may be configured to perform any of the methods disclosed herein.

Another aspect of the disclosed embodiments is a method of filling one or more gaps on a semiconductor substrate with a dielectric material, including: (a) depositing a silicon-containing film in the one or more gaps on the substrate through a plasma enhanced atomic layer deposition surface reaction to partially fill the one or more gaps with the silicon-containing film; and (b) depositing additional silicon-containing film on the film deposited in (a) through a plasma enhanced chemical vapor deposition gas-phase reaction to complete fill of the one or more gaps with the silicon-containing film.

These and other features will be described below with reference to the associated drawings.

DETAILED DESCRIPTION

Figure 1:
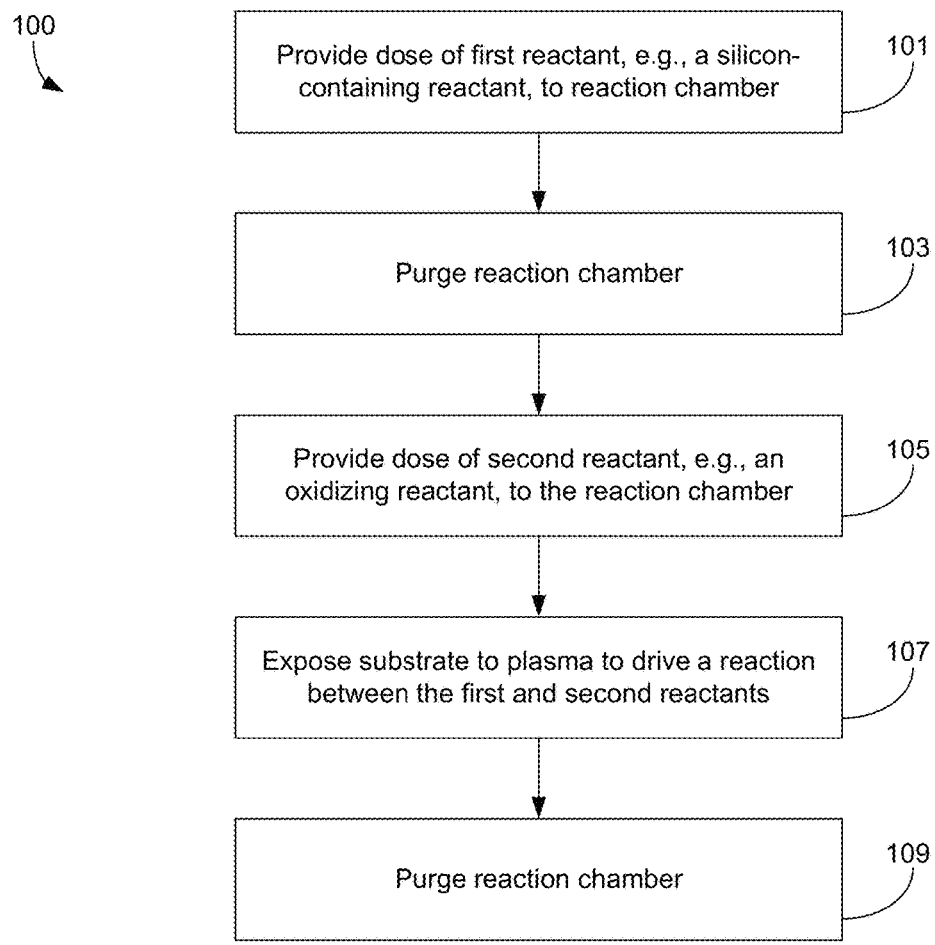
FIG. 1 shows a flowchart of a method of depositing a film through a plasma enhanced atomic layer deposition (PEALD) process.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may have a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, glass panels, and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Conventional gap fill techniques have been unsuccessful in achieving void-free, seam-free fill for high density films in high aspect ratio gaps. HDP, SACVD and LPCVD have only limited fill capability, and typically result in the formation of voids and seams. These voids and seams can open up after a chemical mechanical polishing (CMP) operation, or after an etch-back is performed. These opened seams and voids can then trap materials, such as polysilicon and tungsten, that are subsequently deposited. These materials are often incompletely removed in subsequent CMP or etch-back operations, and can remain in the device to cause shorts and/or loss of yield. Flowable CVD (e.g., flowable oxide) and SOD techniques have complex integration schemes that may result in high costs associated with the various additional steps involved.

Certain embodiments herein relate to a hybrid method of filling differently sized gaps on a semiconductor substrate. The first portion of the method relates to an ALD operation, for example a plasma enhanced ALD (PEALD) operation. The ALD operation may be performed in a novel way to promote a bottom-up type fill in narrow gaps. This bottom-up fill mechanism helps achieve the void-free, seam-free fill, particularly in narrow gaps (e.g., gaps having a critical dimension (CD) of about 50 nm or less) and/or gaps having high aspect ratios (e.g., depth to width aspect ratio of about 4:1 or higher). The ALD operation also acts to form a layer on, but not completely fill, wider gaps present on the substrate (e.g., gaps having a CD larger than about 50 nm) having lower aspect ratios (e.g., aspect ratios of about 4:1 or lower).

The second portion of the method relates to a plasma enhanced chemical vapor deposition (PECVD) method that is used to fill the remainder of the wider gaps. In certain embodiments, this method may be performed using a direct (in situ) capacitively coupled plasma. In many embodiments, a radio frequency (RF) plasma source is employed, though any type of plasma source capable of generating a direct plasma may be employed, including microwave and DC sources. Further, in some embodiments, a remotely-generated plasma may be employed. The remote plasma may be capacitively-coupled or inductively-coupled according to various embodiments.

The plasmas used in the PECVD methods described herein may have lower plasma density than high density plasmas generated by in-situ inductively coupled plasma generators such as those used in HDP processes. For example, in HDP processes plasma densities may be on the order of about $10^{11}$-$10^{13}$ ions/cm$^3$, as opposed to about $10^8$-$10^{10}$ ions/cm$^3$ for PECVD processes in certain embodiments. HDP methods generally do not produce the required fill results, as described above, and typically require the use of etch operations between subsequent deposition steps. In HDP methods, charged dielectric precursor species are directed downwards to fill the gap. This results in some sputtering of material, which can then redeposit on the sidewalls of the gap, especially near the top of the gap, as well as in the field region. Further, uncharged particles present in the chamber may deposit in the upper sidewall region, as well. This unwanted deposition can build up to form sidewall deposits and top-hats, which prevent the gap from being uniformly filled. Etch steps may be used to combat the undesired upper sidewall deposition that occurs with HDP, though this increases the complexity of the deposition method. If no etch steps are performed, the gap will generally not be able to fill without formation of a void. The HDP methods are also much more expensive to implement, with a lower throughput than PECVD methods.

According to various embodiments, the PEALD and PECVD methods may be implemented in the same chamber. Both of these types of processes run in similar pressure and flow regimes, and can use the same RF power sources. Further, the PECVD methods may be performed in a single step, meaning that no intervening etching operations (or other processes such as deposition processes) are required. By contrast, it is not practical to run PEALD and HDP processes in the same chamber. First, the two processes operate in substantially different pressure regimes. PEALD processes generally run in the range of a few Torr, and benefit from high gas flows for purging. HDP processes operate in the mTorr range, which requires relatively low gas flows compared to what is used with PEALD. Next, HDP processes are typically practiced in large volume chambers, while ALD processes benefit from substantially smaller volumes. Furthermore, HDP processes generally require a different power source than PEALD, which would further complicate reactor design.

Although HDP processes have shown good gap fill, HDP processes suffer from engineering problems related to "forbidden gap" sizes. Where a hybrid ALD/HDP deposition approach is used, a forbidden gap may exist where the CD of the gap is slightly larger than 2× the thickness of the ALD layer deposited. In these cases, the HDP processes are unable to fill the remaining gap. The PECVD methods described herein can fill gaps including those previously lined with PEALD. After any challenging structures are lined/filled with PEALD, the PECVD process may be used to fill remaining structures in a less conformal manner.

The PECVD operation is advantageous in achieving a high deposition rate to fill larger gaps that would take a long time to fill through ALD alone. In some embodiments, however, the methods include only the first operation of performing PEALD.

In various embodiments, the PEALD and PECVD operations are performed in the same chamber. This setup is beneficial, as there is no need to transfer the substrate from a PEALD reaction chamber to a PECVD reaction chamber. Thus, there is no need to worry about moisture getting on or into the film, and there is no corresponding need to perform a de-gassing operation or high temperature anneal to remove the moisture before performing the PECVD operation. Another benefit to the single chamber approach is that it reduces capital costs, cycle times and process flow complexity.

Variations may be made to the basic method described above to achieve different hybrid filling scenarios. In one example, a first portion of the method includes a PEALD operation performed under optimum conditions for filling a high aspect ratio gap, and a second portion of the method includes a more relaxed PEALD operation such as one having reduced dose and purge times. These relaxed PEALD operations may also promote PECVD or partial PECVD deposition. In another example, an etch step is used to taper the gap profile. The etch step may be performed between a first portion of the method and a second portion of the method (e.g., between a PEALD operation and a PECVD operation), or within a single portion of the method (e.g., between two PEALD operations or between two PECVD operations). Of course, the methods may be combined as appropriate. The optimum solution will depend on the actual distribution of aspect ratios and gap dimensions present on the substrate.

Combined PEALD and PECVD methods for filling gaps on substrates are discussed in U.S. patent application Ser. No. 13/084,399, which was incorporated by reference above. In certain cases, as discussed in Ser. No. 13/084,399, there may be a transition phase between an PEALD operation and a PECVD operation in which both PEALD surface reactions and PECVD gas phase reactions occur simultaneously.

In such embodiments, the completed film is generated in part by ALD/CFD and in part by a CVD process such as PECVD. Typically, the ALD/CFD portion of the deposition process is performed first and the PECVD portion is performed second, although this need not be the case. Mixed ALD/CFD with CVD processes can improve the step coverage over that seen with CVD alone and additionally improve the deposition rate over that seen with ALD/CFD alone. In some cases, plasma or other activation is applied while one ALD/CFD reactant is flowing in order to produce parasitic CVD operations and thereby achieve higher deposition rates, a different class of films, etc.

In certain embodiments, two or more ALD/CFD phases may be employed and/or two or more CVD phases may be employed. For example, an initial portion of the film may be deposited by ALD/CFD, followed by an intermediate portion of the film being deposited by CVD, and a final portion of the film deposited by ALD/CFD. In such embodiments, it may be desirable to modify the CVD portion of the film, as by plasma treatment or etching, prior to depositing the later portion of the film by ALD/CFD.

A transition phase may be employed between the ALD/CFD and CVD phases. The conditions employed during such transition phase different from those employed in either the ALD/CFD or the CVD phases. Typically, though not necessarily, the conditions permit simultaneous ALD/CFD surface reactions and CVD type gas phase reactions. The transition phase typically involves exposure to a plasma, which may be pulsed for example. Further, the transition phase may involve delivery of one or more reactants at a low flow rate, i.e., a rate that is significantly lower than that employed in the corresponding ALD/CFD phase of the process.

Methods

Plasma Enhanced Atomic Layer Deposition

The disclosed PEALD processes are useful in achieving void-free, seam-free fill of relatively narrow/high aspect ratio features. Unexpectedly, certain embodiments of the processes appear to result in a bottom-up fill mechanism where material is preferentially deposited near the bottom of the gap as opposed to the top of the gap as the gap is being filled. Although deposition happens on the sidewalls and field region as well, the film deposits thicker at/near the bottom of the gap and in many cases achieves a tapered profile as the gap is filled. The tapered profile is defined to mean that the film deposits thicker near the bottom and thinner near the top of the gap, as shown in the Experimental section, below. This tapered profile is especially useful in achieving a high quality fill without voids or seams in high aspect ratio features. This fill mechanism was unexpected, as atomic layer deposition methods typically result in the formation of a seam as the sidewalls close in towards one another. By promoting bottom-up fill, this seam can be avoided and a more robust device results.

Without wishing to be bound by any theory or mechanism of action, it is believed that the bottom-up fill mechanism may be caused by preferential film densification near the top of the gap. As the film is exposed to plasma, species present in the plasma (especially ions) bombard the film surface, thereby compacting and densifying the film. Under appropriate conditions, this densification may happen preferentially near the top of the gap. Due to the shape of the gap, it is much easier for ions to bombard the film in the field region and near the top of the gap, as opposed to near the bottom of the gap, which is much more protected. Thus, the film near the top becomes denser and thinner than the material near the bottom of the trench, which remains thicker and less dense.

Another factor that may promote seam-free, void-free, bottom-up filling is that crosslinking may occur between groups present on opposing sidewalls of the gap. As deposition proceeds and the sidewalls close in towards one another, the terminal groups may crosslink with one another, thus avoiding any seam. In the case of a gap-filling silicon oxide film, for example, surface hydroxyls/silanols on one sidewall may crosslink with surface hydroxyls/silanols on the opposing wall, thereby liberating water and forming a silicon-oxide matrix. These terminal cross-linking groups may preferentially be found on the sidewalls of a gap.

A further factor that may promote seam-free, void-free, bottom-up filling is that ligand byproducts may be liberated from the film in a non-uniform manner, such that the byproducts become preferentially trapped at or near the bottom of the gap as opposed to near the top of the gap. This entrapment may lead to a higher deposition rate within the feature, especially near the bottom of the gap. For example, where bis(tertiary-butyl-amino)silane (BTBAS) is used as a precursor, one type of ligand byproduct that may become entrapped is tert-butylamine (TBA). It is understood, however, that where ligands become trapped in a growing film, the properties of the film may be affected to some degree.

FIG. 1 presents a flowchart for a method of performing a plasma enhanced atomic layer deposition process 100. The process 100 begins at operation 101, where a dose of a first reactant is provided to a reaction chamber containing a substrate. The substrate will typically have gaps therein that are to be filled, partially or completely, through the PEALD process. In one embodiment, the PEALD process 100 completely fills gaps of a first type, and partially fills (e.g., lines) gaps of a second type, as discussed further below. In various cases, the first reactant may be a silicon-containing reactant. Next, at operation 103 the reaction chamber is purged, for example with an inert gas or a nitrogen carrier gas. This helps remove any remaining first reactant from the reaction chamber.

At operation 105, the second reactant is provided to the reaction chamber. In certain cases, the second reactant is an oxidizing reactant. The second reactant may also be a mix of reactants. In a particular embodiment, the second reactant is a roughly equal volume flow of oxygen and nitrous oxide. As used herein, the phrase "roughly equal volume flow" means that the flow of a first species and the flow of a second species do not differ by more than about 20%, as measured in SLM. The second reactant is provided in operation 105, which may include pre-flowing the reactant before flowing the reactant coincident with plasma activation in operation 107. When the plasma is activated, it drives a reaction between the first and second reactants on the surface of the substrate. Next, the plasma is extinguished, and then the reaction chamber is purged, for example with inert gas or a nitrogen carrier gas. This operation 109 is referred to as the post-RF purge.

The method 100 is typically repeated a number of times to build up the desired film thickness. By using the conditions and methods disclosed herein, the method 100 can result in a fill having a tapered profile and bottom-up fill characteristics. These factors promote void-free, seam-free fill. Advantageously, the film deposited through the disclosed methods are fairly dense.

In a particular example, operation 101 includes providing BTBAS (or other primary reactant) at a flow rate of about 0.5-2.5 mL/min, or about 1.5-2.5 L/min, for example 2 mL/min, for a time period of between about 0.1-1 second, or about 0.2-0.5 seconds, for example about 0.3 seconds. Operation 103 includes purging the reaction chamber with inert gas for between about 0.1-1 seconds, or between about 0.2-0.5 seconds, for example about 0.3 seconds. Operation 105 includes co-flowing $O_2$ and $N_2O$ at a flow rate between about 2-20 SLM each, or between about 8-12 SLM each, for example about 10 SLM each. Coincident with this reactant delivery, a plasma is generated at operation 107 using between about 300 W-10 kW, or between about 4-6 kW, for example about 5 kW RF power. These values represent the total RF power delivered, which is divided among four stations/pedestals. The plasma exposure lasts for a duration between about 10 milliseconds and 3 seconds, or between about 0.25-1 second, for example about 0.5 seconds. The RF frequency applied to generate the plasma may be about 13.56 or 27 MHz. Next, the reaction chamber is purged with inert gas at operation 109 for a time period between about 10 milliseconds and 5 seconds, or between about 50-150 milliseconds, for example about 90 milliseconds. It should be understood that the above conditions are examples, with other reactants, flow rates, pulse times, and power used as appropriate for the particular implementation.

The PEALD methods described herein may be conformal film deposition (CFD) methods. Plasma enhanced conformal film deposition techniques and apparatus are further discussed and described in U.S. patent application Ser. No. 13/084,399, filed Apr. 11, 2011, and titled "PLASMA ACTIVATED CONFORMAL FILM DEPOSITION," which is incorporated by reference in its entirety above.

PEALD Reactants

The disclosed methods and apparatus are not limited to use with particular precursors. While the methods have already proven to be effective with certain precursors (as shown in the Experimental section) it is believed that the methods may also be used with a variety of other precursors to gain similar benefits.

At least one of the reactants will generally contain an element that is solid at room temperature, the element being incorporated into the film formed by the PEALD/PECVD method. This reactant may be referred to as a principal reactant. The principal reactant typically includes, for example, a metal (e.g., aluminum, titanium, etc.), a semiconductor (e.g., silicon, germanium, etc.), and/or a nonmetal or metalloid (e.g., boron). The other reactant is sometimes referred to as an auxiliary reactant or a co-reactant. Non-limiting examples of co-reactants include oxygen, ozone, hydrogen, hydrazine, water, carbon monoxide, nitrous oxide, ammonia, alkyl amines, and the like. The co-reactant may also be a mix of reactants, as mentioned above.

The PEALD/PECVD process may be used to deposit a wide variety of film types and in particular implementations to fill gaps with these film types. While much of the discussion herein focuses on the formation of undoped silicon oxides, other film types such as nitrides, carbides, oxynitrides, carbon-doped oxides, nitrogen-doped oxides, borides, etc. may also be formed. Oxides include a wide range of materials including undoped silicate glass (USG), doped silicate glass. Examples of doped glasses included boron doped silicate glass (BSG), phosphorus doped silicate glass (PSG), and boron phosphorus doped silicate glass (BPSG). Still further, the PEALD/PECVD process may be used for metal deposition and feature fill.

While the disclosed embodiments are not limited to particular reactants, an exemplary list of reactants is provided below.

In certain embodiments, the deposited film is a silicon-containing film. In these cases, the silicon-containing reactant may be for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butyl silane, allylsilane, sec-butyl silane, thexylsilane, isoamylsilane, t-butyldisilane, di-t-butyldisilane, tetra-ethyl-ortho-silicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethyl silane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal ß-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakisdimethyl-amido titanium, hafnium tetrakis(ethylmethylamide), bis(cyclopentadienyl)manganese, bis(n-propyl cyclopentadienyl)magnesium, etc.

In certain implementations, an oxygen-containing oxidizing reactant is used. Examples of oxygen-containing oxidizing reactants include oxygen, ozone, nitrous oxide, carbon monoxide, etc.

In some embodiments, the deposited film contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Other precursors, such as will be apparent to or readily discernible by those skilled in the art given the teachings provided herein, may also be used.

Gap Conditions

The disclosed PEALD process is especially useful for filling relatively narrow gaps (CD< about 50 nm) having a relatively high aspect ratio (AR> about 4:1). However, the process may also be performed on larger gaps and gaps having smaller ARs, as well.

In various embodiments, the PEALD process is performed on a substrate having at least two different types of gaps. A first type may include gaps having a CD less than about 50 nm, and/or an AR greater than about 4:1. This first type is referred to as a narrow gap. A second type may include gaps having a CD greater than about 50 nm, and/or an AR less than about 4:1. This second type is referred to as a wide gap. For the reasons discussed above, it can be difficult to simultaneously fill both narrow and wide gaps. Another way to characterize the different types of gaps is by comparing their sizes relative to one another. In some cases, a wide gap is at least about 2 times, or at least about 5 times, or at least about 10 times wider than a narrow gap. In these or other cases, the AR of the narrow gap may be at least about 2 times, or at least about 5 times, or at least about 10 times greater than the AR of the wide gap.

Figure 2:
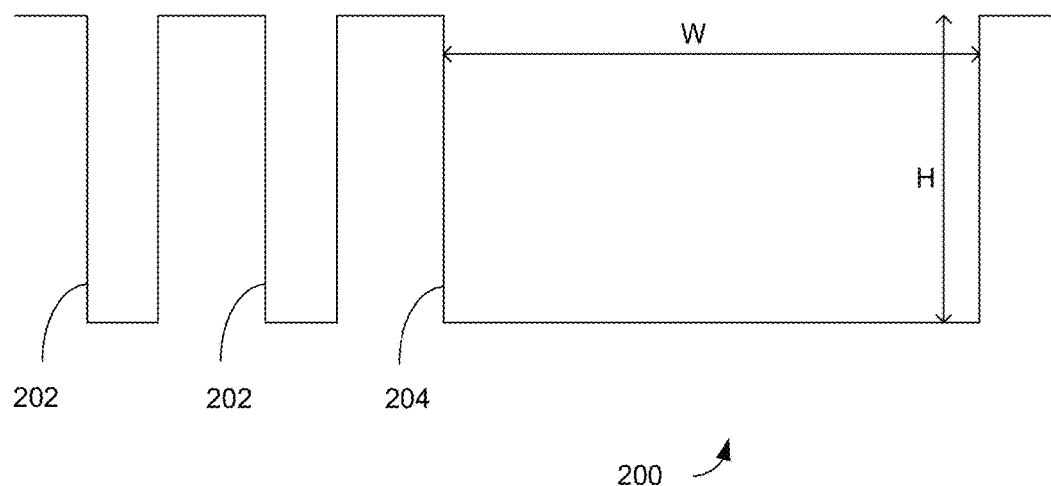
FIG. 2 shows a substrate having gaps of different aspect ratios that may be filled according to the disclosed embodiments.

In many implementations where the PEALD process is performed on a substrate having both narrow and wide gaps, the PEALD process will act to completely fill the narrow gap, and line the surface of the wide gap. FIG. 2 presents a substrate 200 having two different types of gaps 202 and 204. The aspect ratio of the gaps is calculated as the height of the gap divided by the width of the gap. These dimensions are labeled in FIG. 2. Gaps 202 are narrow gaps having an aspect ratio slightly larger than 4:1. Gaps 204 are wide gaps having an aspect ratio of about 1:2.

Figure 3:
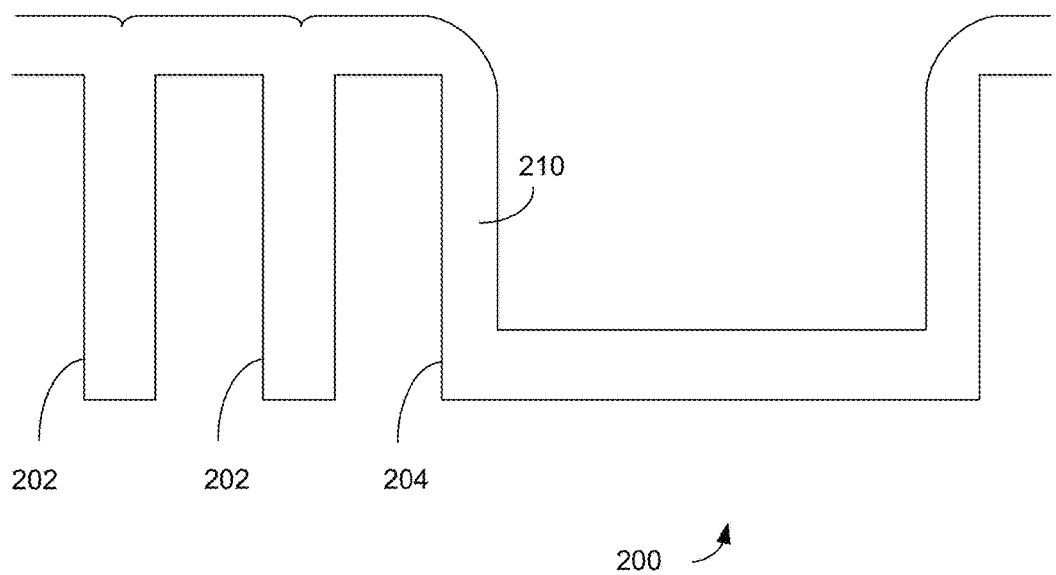
FIG. 3 shows the substrate of FIG. 2 after a PEALD deposition process is performed.

FIG. 3 shows the same substrate 200 after a PEALD deposition process is performed to deposit an oxide layer 210. The narrow gaps 202 are completely filled, while the wide gap 204 is lined with oxide material 210. The film 210 deposited on the bottom of the wide gap 204 may be slightly thicker than the film 210 deposited on the sidewalls of gap 204. However, this thickness difference is much more pronounced in the narrow gap 202 as it fills with material.

Figure 4:
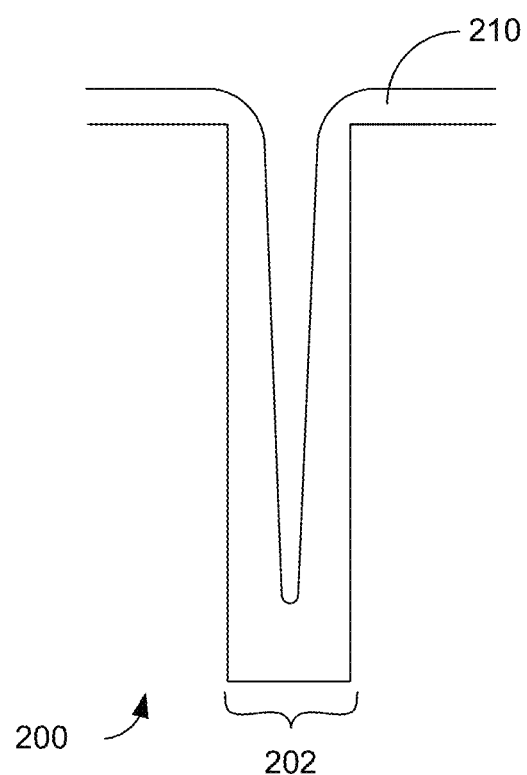
FIG. 4 shows a close-up view of a narrow gap of FIGS. 2 and 3 as the PEALD process is performed to fill the gap.

FIG. 4 shows a portion of substrate 200 at a time during the PEALD deposition process. In particular, narrow gap 202 is shown mid-deposition. The deposited oxide layer 210 has a tapered profile, such that the film is thinner near the top of the gap and thicker near the bottom of the gap. This results in a diminishing gap that is smaller at the bottom than at the top. This shape is ideal for promoting void-free, seam-free fill. As material fills into the bottom of the gap, the mechanisms described above (e.g., preferential film densification, preferential ligand trapping, and/or crosslinking) may act to fill the feature without any voids or seams. Experimental results demonstrating such a fill mechanism are included below in the Experimental section.

This fill mechanism has not been previously observed with PEALD type processes. Instead, conventional PEALD processes form films that have no such tapered profile, where more vertical sidewalls grow towards one another and meet in the center. In these conventional methods, chemicals may get trapped in the extremely narrow void/seam formed in the center of the gap. This trapping is likely to occur, in part because the entire height of the gap closes in at substantially the same time. Conversely, with the disclosed methods, the sidewalls close in towards each other to a greater degree towards the bottom of the gap as opposed to the top of the gap. Thus, as the sidewalls grow towards one another, the bottom of the deposited film grows upwards, and chemicals present in the gap are pushed out. This results in a process where seam and void formation is avoided, producing an excellent quality filled gap.

In some embodiments, a gap filled by a PEALD operation has a reentrant profile. In other words, the gap is smaller at an upper portion and wider at a lower portion. It has been observed that bottom-up fill can be achieved with the disclosed PEALD process, even with gaps that have a somewhat reentrant profile. These results are shown below in the Experimental section.

Chamber Conditions

The PEALD process has been shown to be fairly resilient to changes in temperature. In particular, the process has been shown to be effective at 200° C. and 400° C. In some embodiments, therefore, the process is conducted at a temperature between about 200-400° C. In other cases, however, the temperature may fall outside this range.

The pressure inside the reaction chamber during the PEALD process may be between about 1-10 Torr, or between about 3-7 Torr, for example about 6 Torr.

Plasma Generation Conditions

In the PEALD operation, the substrate is exposed to plasma to drive the reaction between the first and second reactants. Various types of plasma may be used to drive this reaction including capacitively coupled plasmas and inductively coupled plasmas. Various types of plasma generators may be used including RF, DC, and microwave plasma generators. Moreover, according to various embodiments, the plasma may be direct or remote.

The gas used to generate the plasma may include an inert gas such as argon or helium. The gas will also typically include one of the reactants, for example an oxidizing reactant where an oxide film is being formed.

In many cases, an RF signal is used to drive plasma formation. In some embodiments, the RF applied is high frequency RF only, for example at a frequency of about 13.56 or 27 MHz. In other embodiments, the RF has a low frequency component as well. The RF power delivered to drive plasma formation may be between about 300 W and about 10 kW. In some cases, the RF power delivered is between about 4-6 kW, for example about 5 kW. These values represent the total power delivered, which is divided among four stations/pedestals.

Additional plasma generation conditions are discussed in U.S. patent application Ser. No. 13/084,399, filed Apr. 11, 2011, and titled "PLASMA ACTIVATED CONFORMAL FILM DEPOSITION," which is incorporated by reference above.

The duration of plasma exposure may vary between different embodiments. In some cases, RF power is applied for between about 10 milliseconds and 3 seconds, or between about 0.25 seconds and about 1 second. In a particular example, RF power is applied for about 0.5 seconds. The RF power and RF time determine the RF flux delivered to the chamber. It has been found that by increasing the RF flux (either by increasing RF time or power), the wet etch rate (WER) of the film may be reduced. Because the PEALD process has shown a fair resilience to different RF conditions, these variables may be used to achieve a tunable WER.

Purge Conditions

Generally, two sweep/purge operations occur during a single cycle of a PEALD reaction. The first purge occurs after the dose of the first reactant is delivered to the processing chamber, and may be referred to as a reactant purge. This purge is conducted to sweep out any remaining, non-adsorbed first reactant. The second purge occurs after the substrate is exposed to plasma, and may be referred to as the post-RF purge. This purge is conducted to sweep out any remaining reactants, as well as any film formation byproducts.

There are various ways to purge a reaction chamber. One method involves supplying the chamber with a flow of non-reactant gas (e.g., argon, helium, nitrogen, etc.) to sweep out any undesired species. With a sweep, the pressure in the reaction chamber stays substantially constant. Another method of purging a reaction chamber is to perform a pump down. Where this is the case, a vacuum is applied and the reaction chamber is evacuated. During the evacuation, the pressure in the reaction chamber is significantly reduced, for example to less than about 1 Torr.

It has been found that gapfill results are better where the post-RF purge includes a sweep, as compared to a pump down. Without wishing to be bound by a particular theory or mechanism of action, it is believed that the post-RF conditions, including the presence or absence of a pump down, may affect the surface functionality present on the surface of the deposited film. This surface functionality may determine whether or not crosslinking occurs between opposing sidewalls as the gap is filled. One way to encourage the desired bottom-up deposition pattern is to sweep the reaction chamber instead of performing a pump down. Thus, in certain embodiments, no pump down is performed after plasma exposure during the PEALD deposition. In some cases, however, a pump down may be performed between a PEALD operation and a PECVD operation.

The reactant purge may be performed for a duration between about 0.1-1 seconds, for example between about 0.2-0.5 seconds. In a particular example, the reactant purge has a duration of about 0.3 seconds.

The post-RF purge may be performed for a duration between about 0.01-5 seconds, for example between about 0.05-0.15 seconds. In one case the post-RF purge has a duration of about 0.09 seconds.

Plasma Enhanced Chemical Vapor Deposition

The PECVD methods disclosed herein may be practiced after a PEALD process to finish filling gaps that were only partially filled/lined. This method is advantageous compared to a PEALD process alone because it offers a much higher deposition rate, resulting in decreased processing times and increased throughput. Thus, the PEALD process may be used to fill small gaps and line large gaps, and then the PECVD process may be used to complete the filling of the large gaps. This offers a convenient way to fill features of varying sizes and aspect ratios. In many cases, the gaps can be filled without any intervening etching operations.

Figure 5:
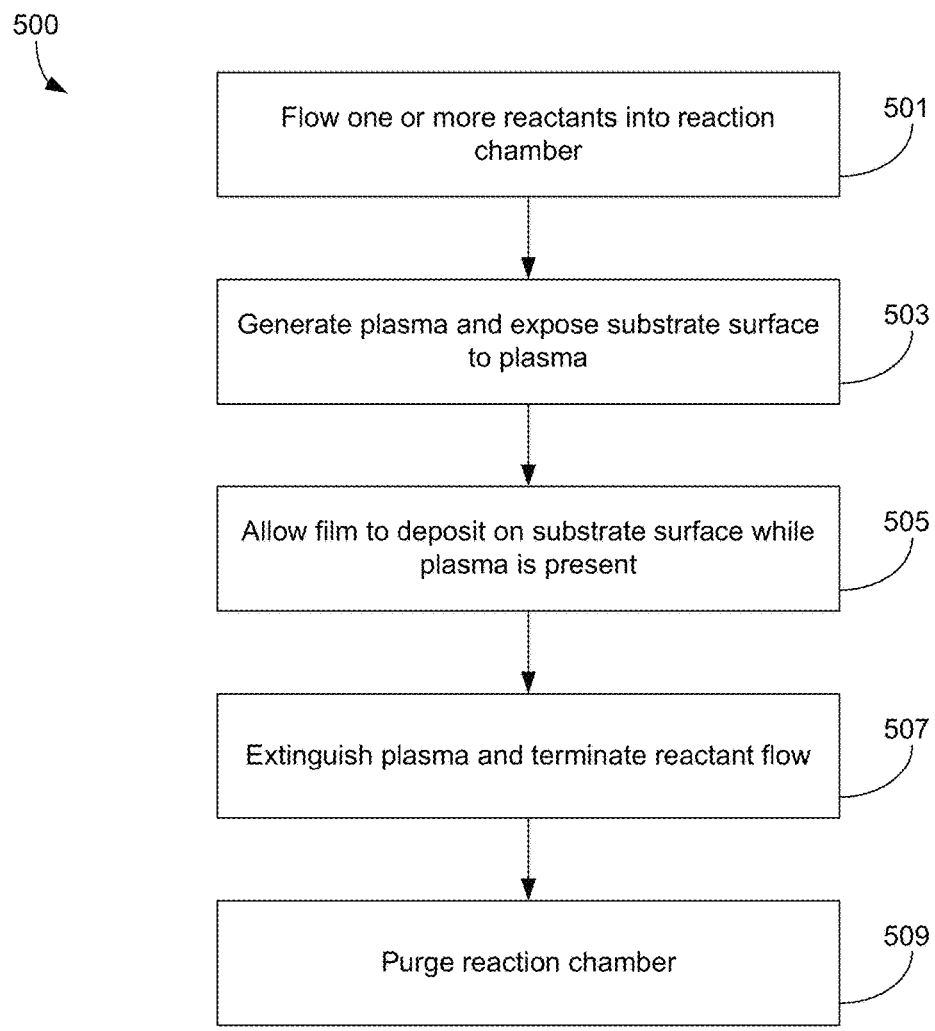
FIG. 5 shows a flowchart of a method of depositing a film through a plasma enhanced chemical vapor deposition (PECVD) process.

In a PECVD reaction, a substrate is exposed to one or more volatile precursors, which react and/or decompose to produce the desired deposit on the substrate surface. FIG. 5 shows a flow chart for a method 500 of filling a gap with PECVD. In various embodiments, the method 500 may be performed after the method 100 of FIG. 1. The PECVD method generally begins by flowing one or more reactants into the reaction chamber at operation 501. The reactant delivery may continue as plasma is generated in operation 503. The substrate surface is exposed to plasma, which causes deposition to occur on the substrate surface in operation 505. This process continues until a desired film thickness is reached. At operation 507, the plasma is extinguished and the reactant flow is terminated. Next, the reaction chamber is purged at operation 509.

In one example process, operation 501 includes flowing TEOS at a rate of about 1-20 mL/min and $O_2$ at a rate of about 2,000-30,000 sccm. RF power is applied with an HF component between about 200-3,000 W, and an LF component between about 200-2,500 W (divided among four stations). The HF frequency is about 13.56 or 27 MHz, while the LF frequency is between about 300-400 kHz. The pressure in the reaction chamber is between about 1-10 Torr, and the temperature is between about 100-450° C. Of course, it is understood that in other embodiments, the reactants, chamber conditions, timing, etc. may vary depending on the desired film and application. The values provided in this section are not intended to be limiting.

PECVD methods and apparatus are further discussed and described in the following patent documents, which are each herein incorporated by reference in their entireties: U.S. Pat. No. 7,381,644, titled "PULSED PECVD METHOD FOR MODULATING HYDROGEN CONTENT IN HARD MASK"; U.S. Pat. No. 8,110,493, titled "PULSED PECVD METHOD FOR MODULATING HYDROGEN CONTENT IN HARD MASK"; U.S. Pat. No. 7,923,376, titled "METHODS OF REDUCING DEFECTS IN PECVD TEOS FILMS"; and U.S. patent application Ser. No. 13/478,999, titled "PECVD DEPOSITION OF SMOOTH SILICON FILMS," filed May 23, 2012.

In many cases, there will be no downtime between a PEALD process and a PECVD process. For example, the PEALD process may end by extinguishing the plasma, performing the post-RF purge (with or without a pump down), and then immediately flowing the PECVD reactant(s).

In some embodiments, hybrid PEALD/PECVD methods as discussed and described in U.S. patent application Ser. No. 13/084,399, filed Apr. 11, 2011, and titled "PLASMA ACTIVATED CONFORMAL FILM DEPOSITION," which is incorporated by reference above, may be used.

PECVD Reactants

The PECVD reaction may be performed with either the same reactants as the ALD reaction, or with different reactants. In one embodiment, the PEALD reaction is performed with BTBAS and a mixture of $O_2/N_2O$, and the PECVD reaction is performed with TEOS and/or silane. The TEOS and silane reactants have been found to be especially useful in practicing the PECVD reaction. Generally, the reactants listed above in the PEALD Reactants section may be used in the PECVD reaction.

The flow rate of reactants may vary depending on the desired process. In one embodiment related to PECVD undoped silicate glass (USG), $SiH_4$ is used as a reactant and has a flow rate between about 100-1,500 sccm, with a flow of $N_2O$ between about 2,000-20,000 sccm. In another embodiment related to PECVD using TEOS, the flow of TEOS is between about 1-20 mL/min, and the flow of $O_2$ is between about 2,000-30,000 sccm.

Chamber Conditions

The temperature in the reaction chamber during the PECVD reaction may be between about 50-450° C., in certain embodiments. This range may be especially appropriate for reactions using silane. Where other reactants are used, the temperature range may be more limited or more broad, for example between about 100-450° C. where TEOS is used.

The pressure in the reaction chamber during the PECVD reaction may be between about 1-10 Torr, for example about 5 Torr.

Because the chamber conditions are very similar between the PEALD operation and the PECVD operation, it is feasible to implement both types of reactions in a single reaction chamber. As discussed above, this is advantageous because it reduces or eliminates the risk of moisture entering the film as the substrate is moved between processing chambers, and reduces the need to perform a degassing operation between the two processes.

Plasma Generation Conditions

The PECVD reactions are driven by exposure to plasma. The plasma may be a capacitively coupled plasma or a remotely generated inductively coupled plasma. For the reasons discussed above, it may be preferable to avoid using an in situ inductively coupled plasma.

The gas used to generate the plasma will include at least one reactant. The plasma generation gas may also include other species, as well. For example, in certain embodiments the plasma generation gas includes an inert gas.

The frequency used to drive plasma formation may contain both LF and HF components. In some embodiments the HF frequency may be about 13.56 MHz or about 27 MHz. The LF frequency may be between about 300-400 kHz. The HF RF power used to drive plasma formation may be between about 200-3,000 W. The LF RF power used to drive plasma formation may be between about 200-2,500 W. These power levels represent the total power delivered, which is divided among four stations. The duration of plasma exposure depends on the desired thickness of the deposited film.

In some embodiments, pulsed PECVD methods may be used. These methods may involve pulsing precursor and/or RF power levels.

Purge Conditions

A purge is typically conducted after the PECVD deposition is complete. This purge operates to remove reactants and any byproducts from the reaction chamber. Because the film is already deposited at this point, the purge conditions are less important than with the PEALD reactions, which require many iterations of reactant purge and post-RF purge as the PEALD film is formed.

Apparatus

A suitable apparatus for performing the disclosed methods typically includes hardware for accomplishing the process operations and a system controller having instructions for controlling process operations in accordance with the present invention. For example, in some embodiments, the hardware may include one or more PEALD, PECVD or joint PEALD/PECVD process stations included in a process tool.

Figure 6:
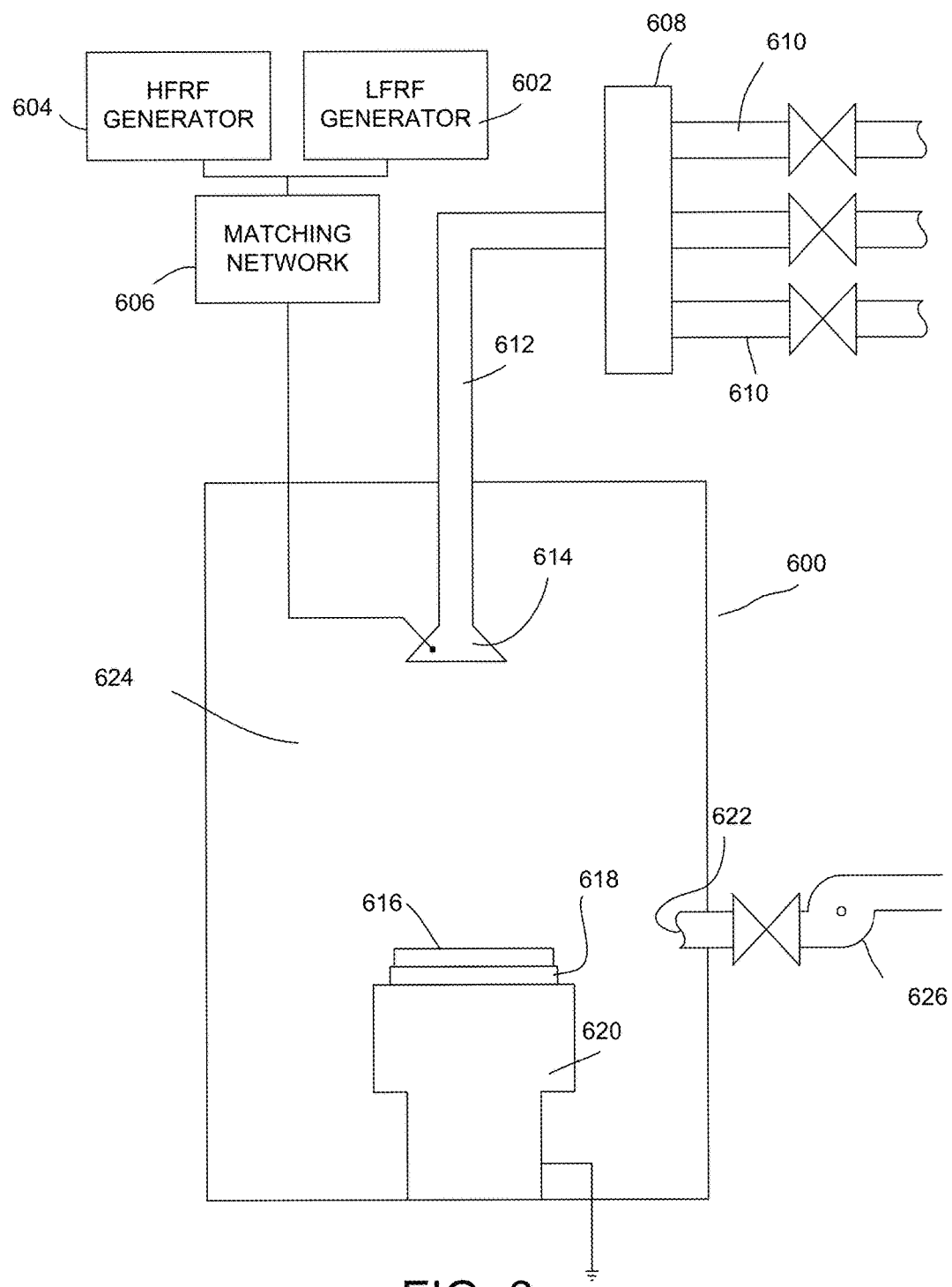
FIG. 6 shows a block diagram of an apparatus that may be used to carry out the disclosed methods.

FIG. 6 provides a block diagram of an example apparatus that may be used to practice the disclosed embodiments. As shown, a reactor 600 includes a process chamber 624, which encloses other components of the reactor and serves to contain the plasma generated by, e.g., a capacitor type system including a showerhead 614 working in conjunction with a grounded heater block 620. A high-frequency RF generator 602, connected to a matching network 606, and a low-frequency RF generator 604 are connected to showerhead 614. The power and frequency supplied by matching network 606 is sufficient to generate a plasma from the process gas, for example 400-700 W total energy. In one implementation of the present invention both the HFRF generator and the LFRF generator are used. In a typical process, the high frequency RF component is generally between about 2-60 MHz; in a preferred embodiment, the HF component is about 13.56 MHz or 27 MHz. The low frequency LF component is generally between about 250-400 kHz; in a particular embodiment, the LF component is about 350 kHz.

Within the reactor, a wafer pedestal 618 supports a substrate 616. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 612. Multiple source gas lines 610 are connected to manifold 608. The gases may be premixed or not. Appropriate valving and mass flow control mechanisms are employed to ensure that the correct gases are delivered during the deposition and plasma treatment phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 600 via an outlet 622. A vacuum pump 626 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Figure 7:
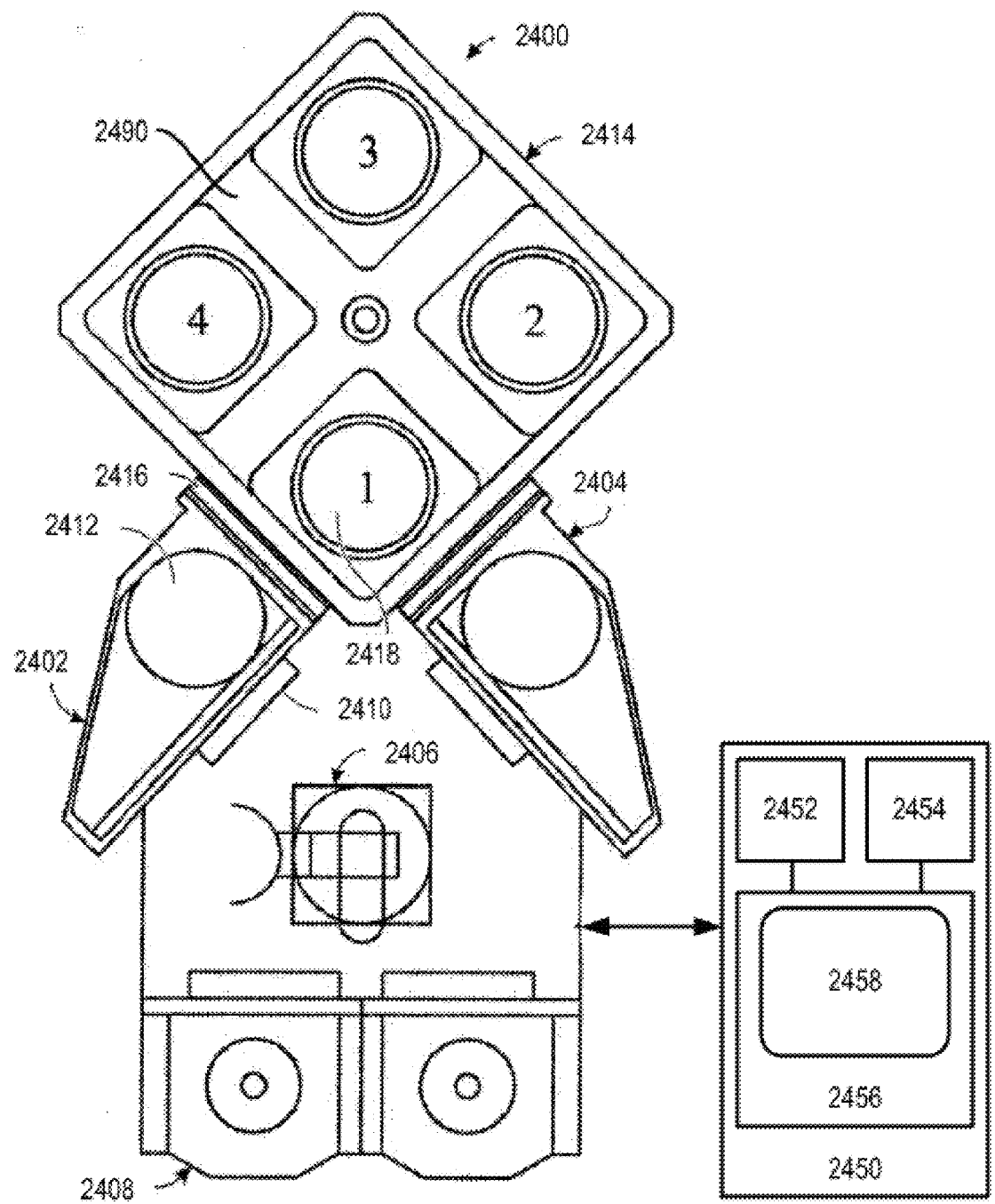
FIG. 7 depicts a multi-station apparatus that may be used to carry out the disclosed methods.

FIG. 7 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 2414 comprises four process stations, numbered from 1 to 4 in the embodiment shown in FIG. 4. Each station has a heated pedestal (shown at 2418 for station 1), and gas line inlets. It will be appreciated that in some embodiments, each process station may have different or multiple purposes. For example, in some embodiments, a process station may be switchable between a PEALD and PECVD process mode. Additionally or alternatively, in some embodiments, processing chamber 2414 may include one or more matched pairs of PEALD and PECVD process stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes in accordance with the disclosed methods. System control software 2458 may be coded in any suitable computer readable programming language.

In some embodiments, system control software 2458 may include input/output control (IOC) sequencing instructions for controlling the various parameters described above. For example, each phase of a PEALD process may include one or more instructions for execution by system controller 2450. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase. The same can be said for PECVD processes and hybrid PEALD/PECVD processes.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF power level, RF bias power level, pressure, temperature, etc. The instructions may control the parameters to operate in-situ deposition of film stacks according to various embodiments described herein.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Figure 8:
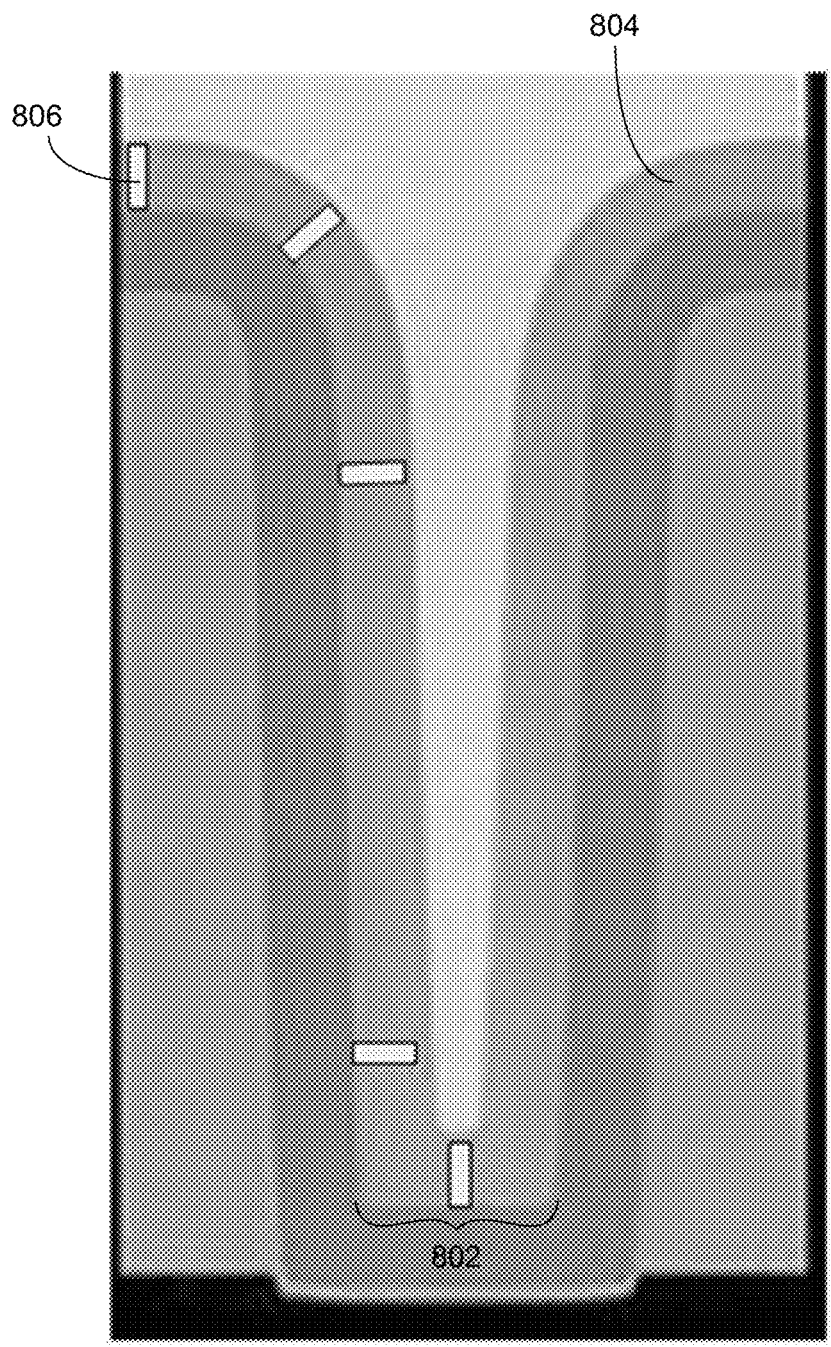
FIG. 8 shows a partially filled high aspect ratio gap that was filled according to the disclosed PEALD methods.

FIG. 8 presents a gap 802 partially filled with silicon oxide film 804 in a PEALD process according to the disclosed methods. Markers 806 are provided in order to evaluate the conformality of the oxide film 804. For the sake of clarity, only one marker is labeled in FIG. 8. Each of the markers 806 has an identical height. Thus, it is apparent that the deposited film is thicker at the bottom than at the top. Further, the lower sidewalls are thicker than the upper sidewalls, which are both thicker than the top region. The film thickness near the top is about the same as the film thickness in the top corner. The silicon oxide film 804 was deposited at about 400° C., with a 2 mL/min flow of BTBAS for a duration of about 0.3 seconds, followed by a reactant purge with a sweep duration of about 0.3 seconds, followed by delivery of a mixture of $O_2/N_2O$ at 10 SLM each, coincident with a 0.5 second exposure to RF plasma, followed by a post-RF purge having a duration of 0.09 seconds. The plasma was a high frequency plasma, with a power of about 5 kW split among four pedestals. The film 804 shows a tapered profile, which is ideal for filling gaps, especially those having large aspect ratios. Although the PEALD process used to create the film 804 was terminated before the gap 802 was completely filled (in order to view the fill behavior), the PEALD process can be continued to completely fill the gap 802 without formation of any seams or voids.

Figure 9:
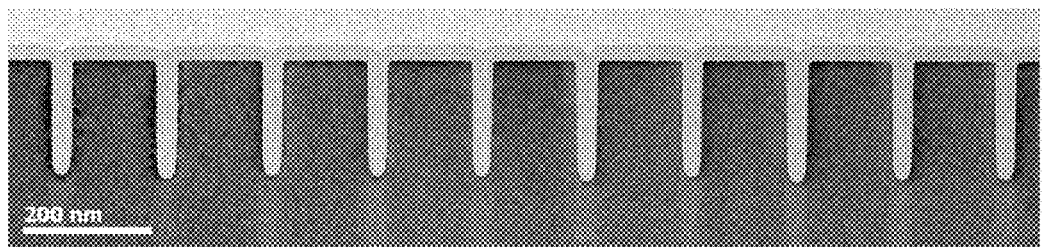
FIGS. 9-11 show additional pictures of high aspect ratio gaps filled according to the disclosed PEALD methods.

FIG. 9 shows a substrate with a number of gaps filled with silicon-oxide according to the disclosed PEALD methods.

The gaps in this case have an aspect ratio of about 7:1, and a CD on the order of about 30 nm. The deposited film was dense, and did not show any seams or voids.

Figure 10:
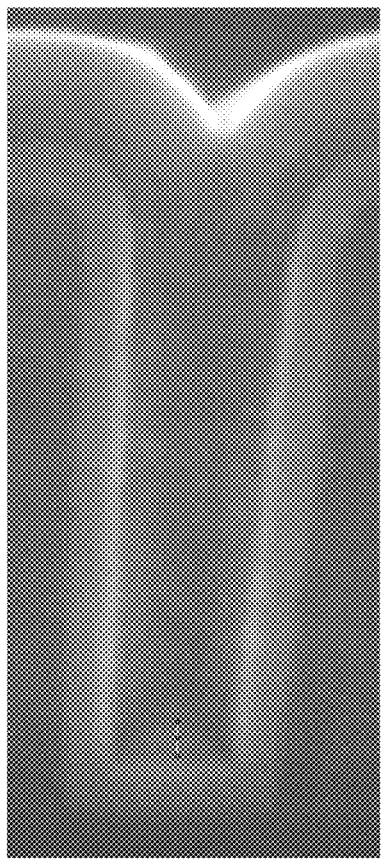

FIG. 10 shows a close-up view of a gap filled according to the disclosed PEALD methods. No seams or voids are detected in the fill.

Figure 11:
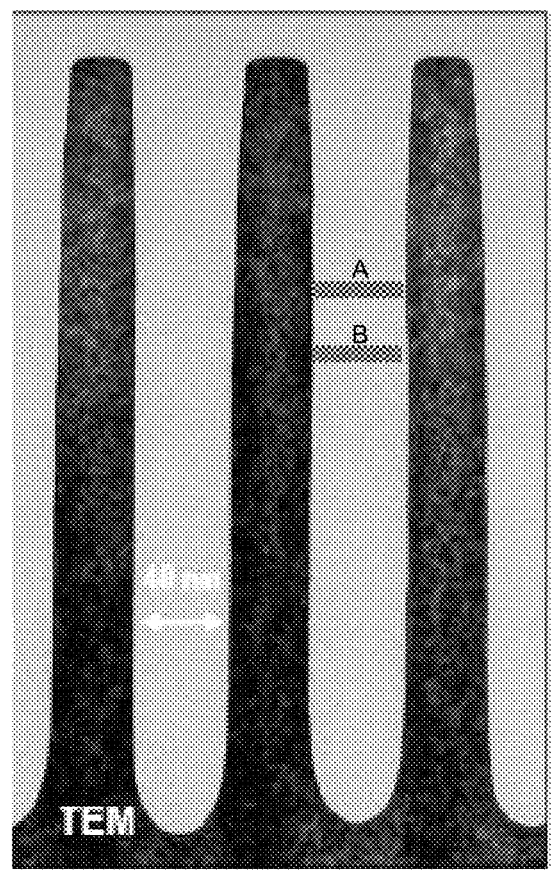

FIG. 11 shows a substrate having high aspect ratio gaps (AR about 8:1) filled according to the disclosed PEALD methods. Notably, the gap on the right shows some degree of reentrancy. The markers A and B are the same length. It can be seen that the gap is wider at marker B than at marker A. While the width difference is fairly slight, even small degrees of reentrancy will result in the formation of voids under many conventional methods.

It should be noted that the gaps shown in FIGS. 8-11 were filled with no etching operations performed.

Figure 12:
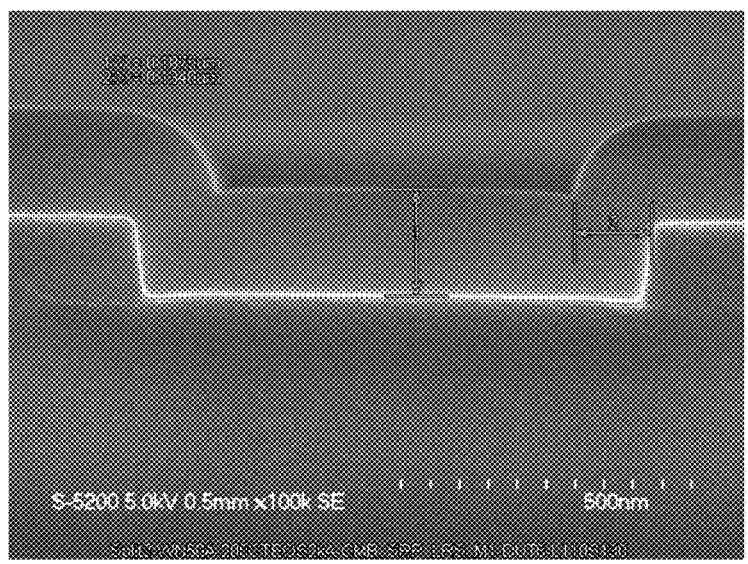
FIG. 12 shows a wide gap filled with silicon oxide deposited according to a disclosed PECVD method.

FIG. 12 shows a wide gap filled with silicon oxide according to a disclosed PECVD method with TEOS performed at about 200° C. The film deposited was about 2,000 Å thick, and showed good gap fill properties, with no voids or seams. No etching operations were performed.

What is claimed is:

1. A method of filling a gap adjacent to a field region on a substrate surface, the method comprising:
   (a) introducing a first reactant in vapor phase into a reaction chamber having the substrate therein, and allowing the first reactant to adsorb onto the substrate surface;
   (b) introducing a second reactant in vapor phase into the reaction chamber;
   (c) exposing the substrate surface to plasma to drive a surface reaction between the first and second reactants on the substrate surface to form a film layer that lines the bottom and sidewalls of the gap, wherein the film layer is denser near the field region and upper sidewalls of the gap compared to near the bottom and lower sidewalls of the gap;
   (d) sweeping the reaction chamber without performing a pumpdown; and
   (e) repeating operations (a) through (d) to form additional film layers to thereby fill the gap through a bottom-up fill mechanism, without formation of a void or seam.

2. The method of claim 1, wherein the first reactant comprises a silicon-containing reactant and the second reactant comprises an oxidizing reactant.

3. The method of claim 1, wherein the gap is reentrant.

4. The method of claim 1, wherein the gap is filled through a bottom-up fill mechanism in which the film layers are deposited thinner near the top of the gap and thicker near the bottom of the gap.

* * * * *